US010635536B2

(12) United States Patent
Baptist et al.

(10) Patent No.: US 10,635,536 B2
(45) Date of Patent: Apr. 28, 2020

(54) DYNAMIC DISTRIBUTED AGREEMENT PROTOCOLS IN A DISPERSED STORAGE NETWORK

(71) Applicant: International Business Machines Corporation, Armonk, NY (US)

(72) Inventors: Andrew D. Baptist, Mt. Pleasant, WI (US); Wesley B. Leggette, Chicago, IL (US); Manish Motwani, Chicago, IL (US); Jason K. Resch, Chicago, IL (US); Ethan S. Wozniak, Park Ridge, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 147 days.

(21) Appl. No.: 15/467,832

(22) Filed: Mar. 23, 2017

(65) Prior Publication Data
US 2017/0286016 A1     Oct. 5, 2017

Related U.S. Application Data

(60) Provisional application No. 62/314,839, filed on Mar. 29, 2016.

(51) Int. Cl.
*G06F 11/10*     (2006.01)
*G06F 3/06*      (2006.01)
(Continued)

(52) U.S. Cl.
CPC .......... *G06F 11/1076* (2013.01); *G06F 3/061* (2013.01); *G06F 3/064* (2013.01);
(Continued)

(58) Field of Classification Search
CPC . G06N 7/005; G06F 12/0888; G06F 2212/60; G06F 11/0264; G06F 2201/84;
(Continued)

(56) References Cited

U.S. PATENT DOCUMENTS 4,092,732 A     5/1978   Ouchi
5,454,101 A     9/1995   Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Yaima Rigol
(74) *Attorney, Agent, or Firm* — James Nock; Andrew D. Wright; Roberts Mlotkowski Safran Cole & Calderon, P.C.

(57) ABSTRACT

A method for execution by a device of a dispersed storage network (DSN) to access a set of encoded data slices. The method begins by performing a first distributed agreement protocol (DAP) function using a slice identifier and a first set of coefficients to identify a set of storage units. The method continues by performing a second DAP function using the slice identifier and a second set of coefficients to identify pillar numbers for the set of storage units. The method continues by sending a set of data access requests to the set of storage units in accordance with the pillar numbers, wherein a data access request of the set of data access requests includes a slice name for a corresponding one of the set of encoded data slices and wherein the slice name includes one of the pillar numbers.

16 Claims, 16 Drawing Sheets

(51) Int. Cl.
    *H04L 29/08*     (2006.01)
    *G06F 11/36*     (2006.01)
    *G06F 11/16*     (2006.01)
    *H03M 13/15*     (2006.01)
    *H03M 13/00*     (2006.01)
    *H03M 13/37*     (2006.01)

(52) U.S. Cl.
CPC ............ *G06F 3/0604* (2013.01); *G06F 3/067* (2013.01); *G06F 3/0619* (2013.01); *G06F 3/0631* (2013.01); *G06F 3/0635* (2013.01); *G06F 3/0644* (2013.01); *G06F 3/0647* (2013.01); *G06F 3/0653* (2013.01); *G06F 3/0659* (2013.01); *G06F 11/1092* (2013.01); *G06F 11/1662* (2013.01); *G06F 11/3684* (2013.01); *G06F 11/3688* (2013.01); *G06F 11/3692* (2013.01); *H03M 13/1515* (2013.01); *H03M 13/616* (2013.01); *H04L 67/1097* (2013.01); *G06F 2201/805* (2013.01); *G06F 2201/82* (2013.01); *H03M 13/373* (2013.01)

(58) Field of Classification Search
CPC ........... G06F 2201/855; G06F 11/1076; G06F 3/0604; G06F 3/061; G06F 3/0619; G06F 3/0631; G06F 3/0635; G06F 3/064; G06F 3/0644; G06F 3/0647; G06F 3/0653; G06F 3/0659; G06F 3/067; G06F 11/1092; G06F 11/1662; G06F 11/3684; G06F 11/3688; G06F 11/3692; G06F 2201/805; G06F 2201/82; H03M 13/1515; H03M 13/1616; H03M 13/373; H04L 67/1097
USPC ........................................................ 711/154
See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 8,732,206 B2 * | 5/2014 | Resch .................... H04L 12/00 707/793 | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2011/0185258 A1 * | 7/2011 | Grube ............... G06F 17/30194 714/763 | |
| 2012/0291099 A1 * | 11/2012 | Grube ................ H04L 67/1097 726/3 | |
| 2013/0232503 A1 * | 9/2013 | Volvovski ........... G06F 11/1044 718/104 | |
| 2013/0262959 A1 * | 10/2013 | Resch .................... G06F 11/10 714/766 | |
| 2015/0381730 A1 * | 12/2015 | Resch .................. G06F 3/0616 709/225 | |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

(56) References Cited

OTHER PUBLICATIONS

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Kin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

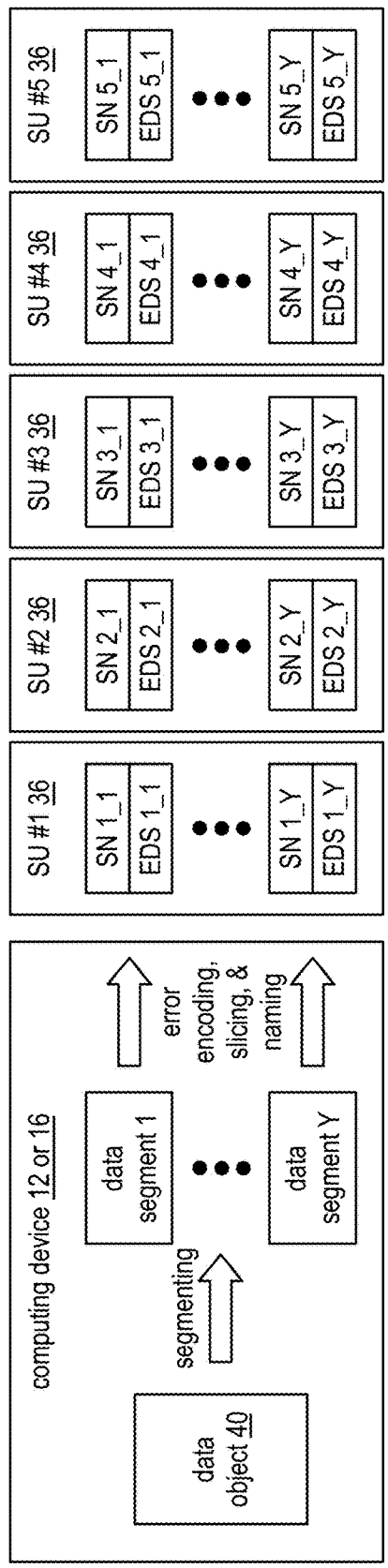
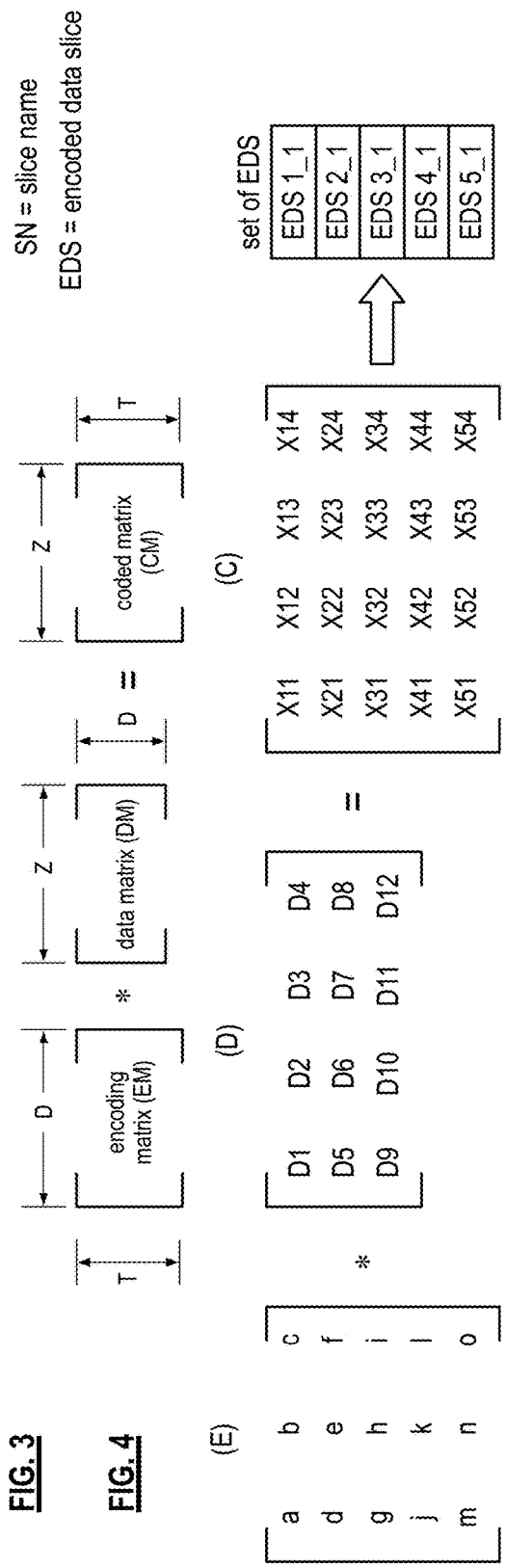
FIG. 3
FIG. 4
FIG. 5
FIG. 6

DYNAMIC DISTRIBUTED AGREEMENT PROTOCOLS IN A DISPERSED STORAGE NETWORK

CROSS-REFERENCE TO RELATED APPLICATIONS

The present U.S. Utility Patent Application claims priority pursuant to 35 U.S.C. § 119(e) to U.S. Provisional Application No. 62/314,839 entitled "PROCESSING AN ENCODED DATA SLICE IN A DISPERSED STORAGE NETWORK," filed Mar. 29, 2016, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
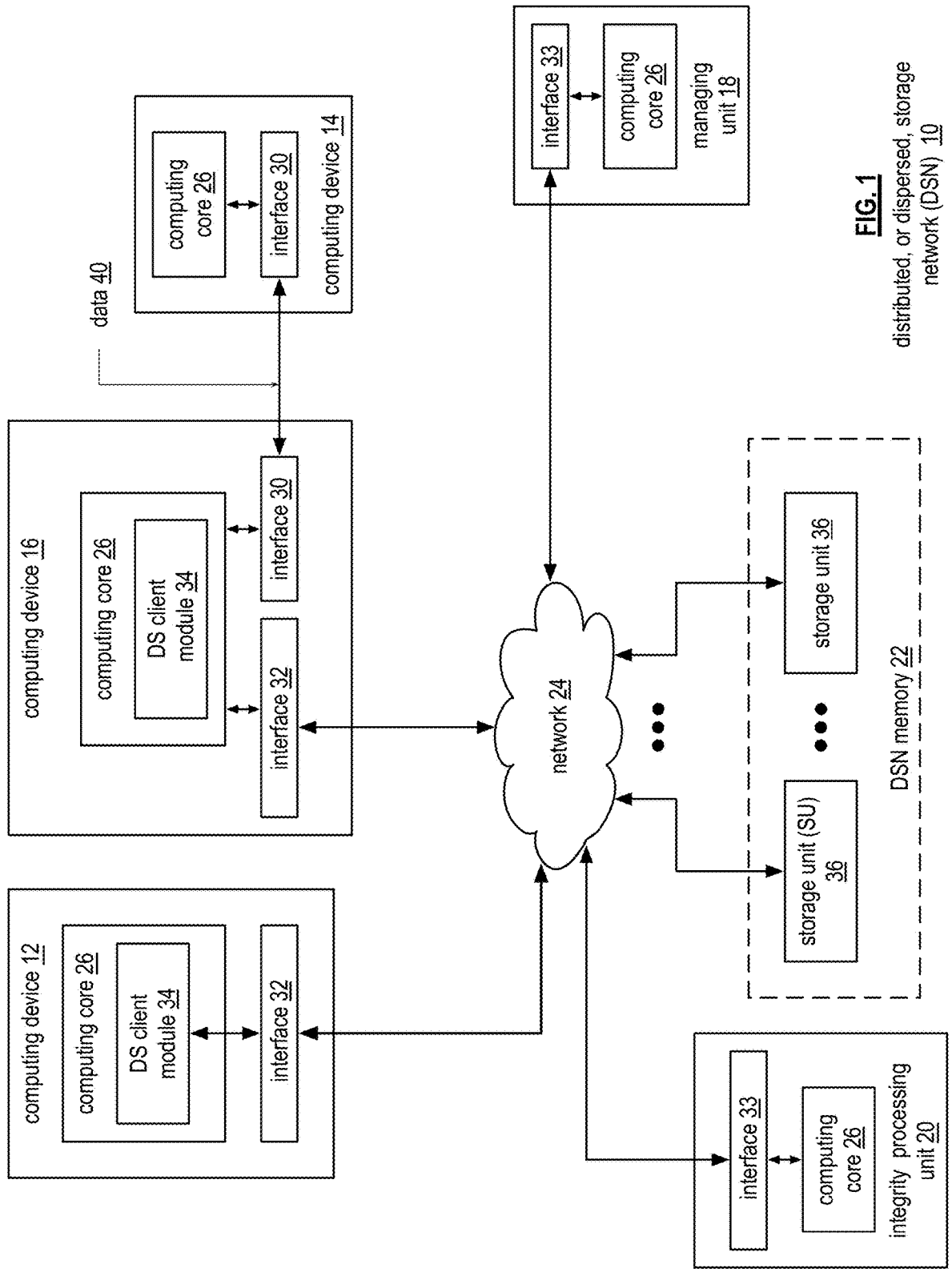
FIG. 1 is a schematic block diagram of an embodiment of a dispersed or distributed storage network (DSN) in accordance with the present invention.

FIG. 1 is FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
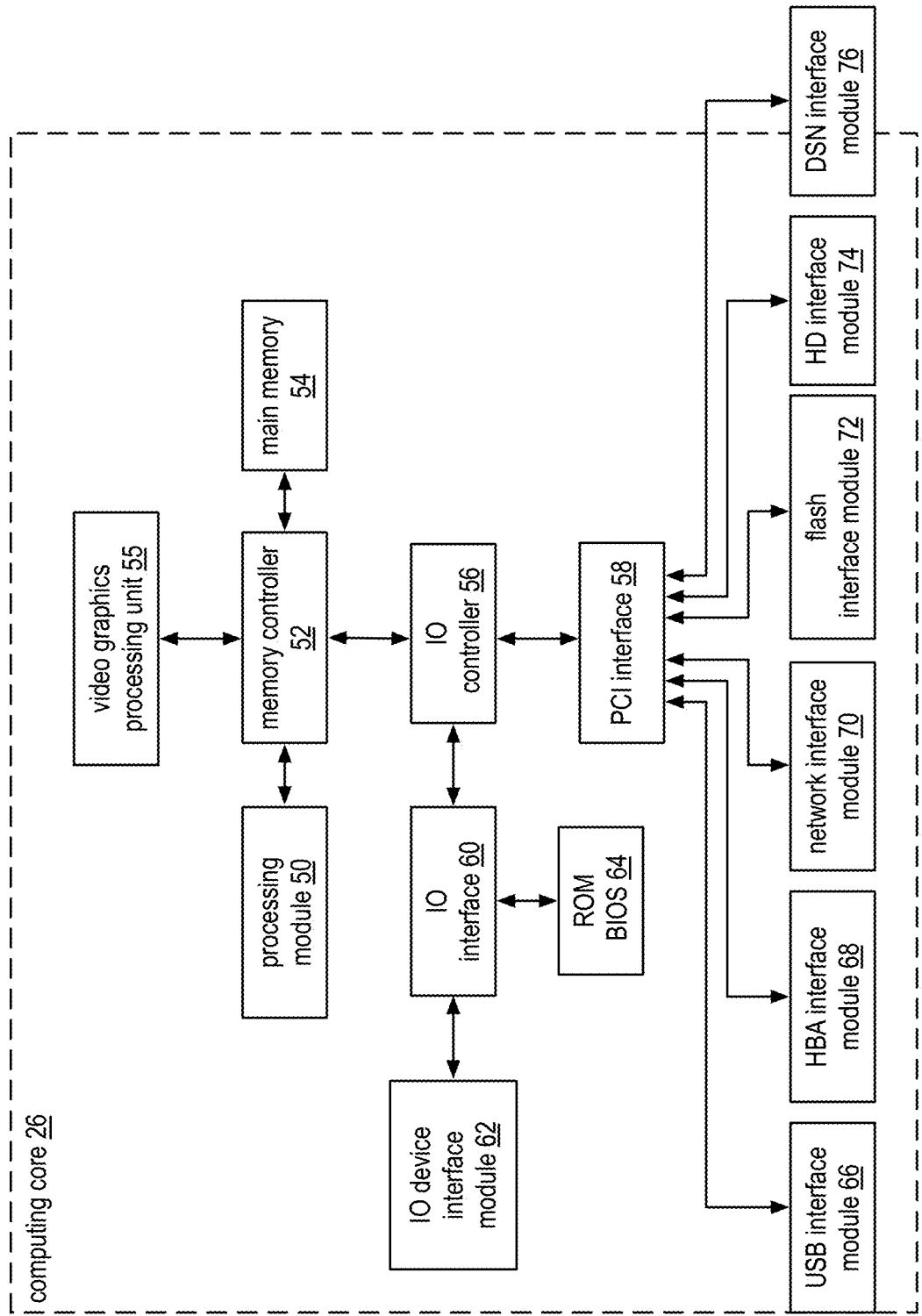
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate a per-access billing information. In another instance, the DSTN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one 10 device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 78 is shown in FIG. 6. As shown, the slice name (SN) 78 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
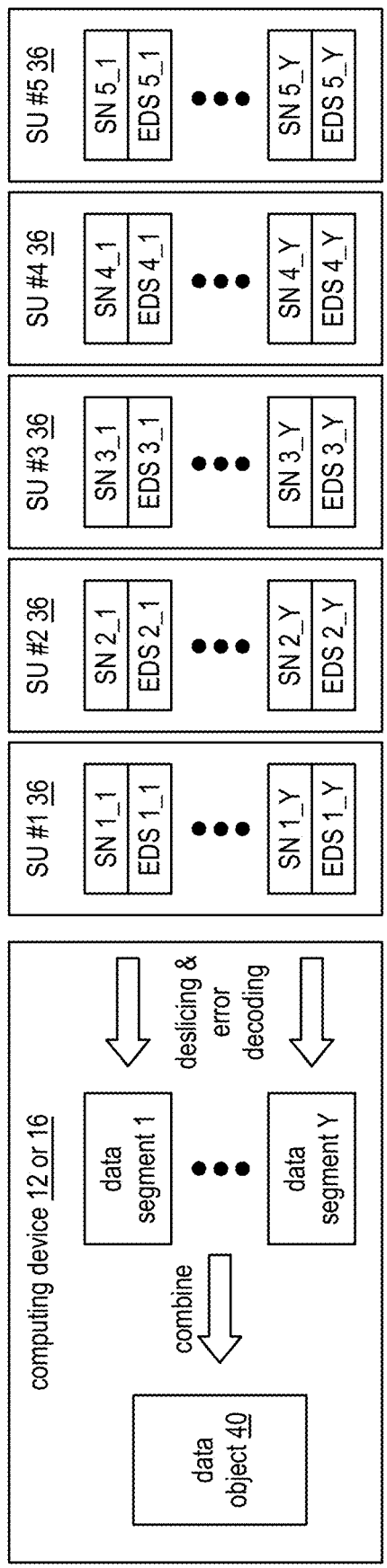
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
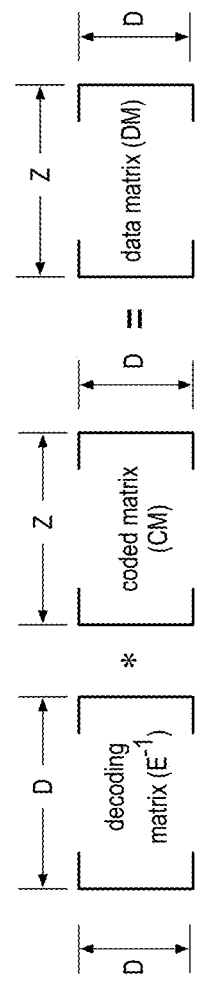
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
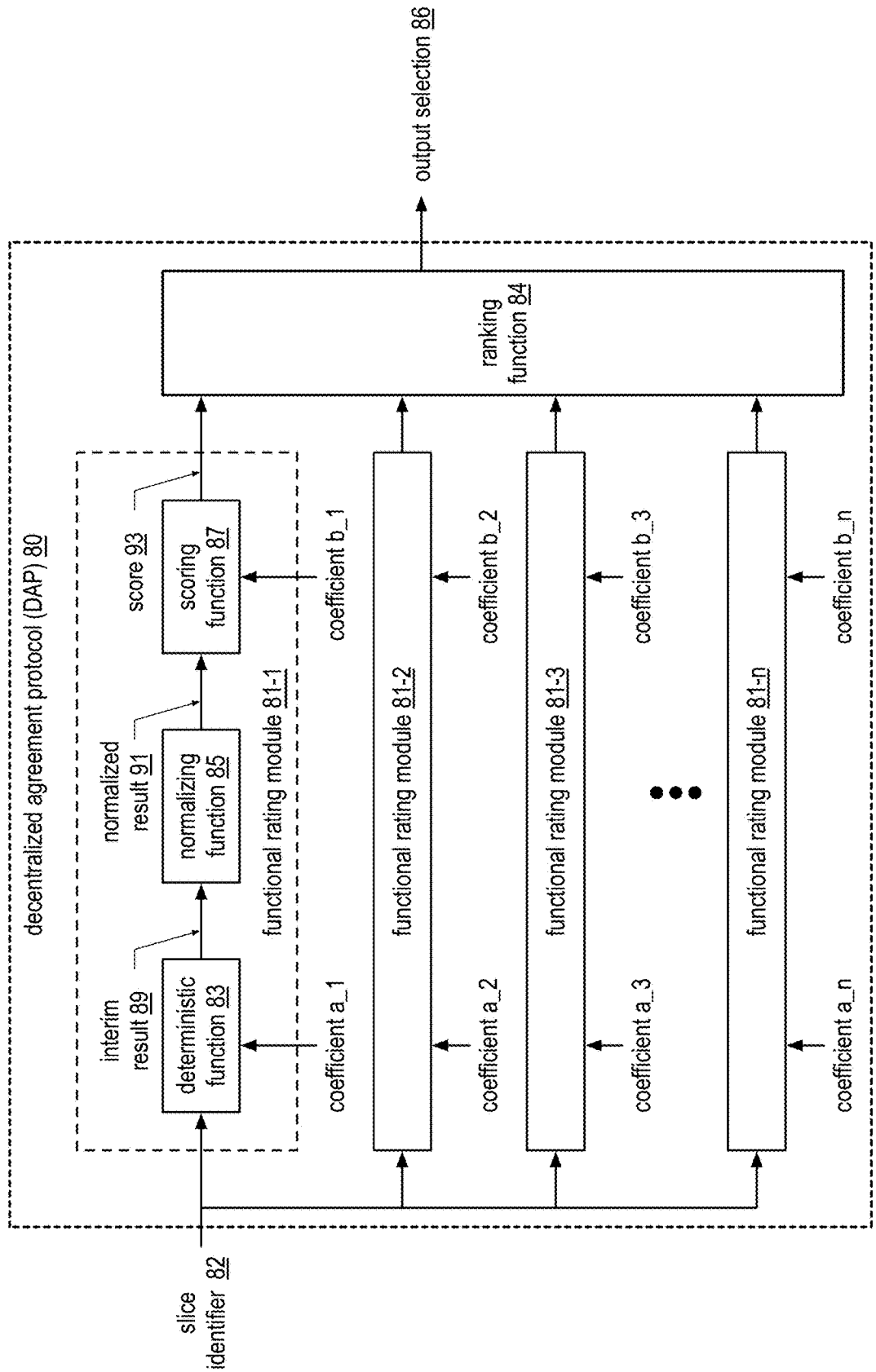
FIG. 9 is a schematic block diagram of an embodiment of a decentralized agreement protocol in accordance with the present invention.

FIG. 9 is a schematic block diagram of an embodiment of a decentralized, or distributed, agreement protocol (DAP) 80 that may be implemented by a computing device, a storage unit, and/or any other device or unit of the DSN to determine where to store encoded data slices or where to find stored encoded data slices. The DAP 80 includes a plurality of functional rating modules 81. Each of the functional rating modules 81 includes a deterministic function 83, a normalizing function 85, and a scoring function 87.

Each functional rating module 81 receives, as inputs, a slice identifier 82 and storage pool (SP) coefficients (e.g., a first functional rating module 81-1 receives SP 1 coefficients "a" and b). Based on the inputs, where the SP coefficients are different for each functional rating module 81, each functional rating module 81 generates a unique score 93 (e.g., an alpha-numerical value, a numerical value, etc.). The ranking function 84 receives the unique scores 93 and orders them based on an ordering function (e.g., highest to lowest, lowest to highest, alphabetical, etc.) and then selects one as a selected storage pool 86. Note that a storage pool includes one or more sets of storage units. Further note that the slice identifier 82 corresponds to a slice name or common attributes of set of slices names. For example, for a set of encoded data slices, the slice identifier 82 specifies a data segment number, a vault ID, and a data object ID, but leaves open ended, the pillar number. As another example, the slice identifier 82 specifies a range of slice names (e.g., 0000 0000 to FFFF FFFF).

As a specific example, the first functional rating module 81-1 receives the slice identifier 82 and SP coefficients for storage pool 1 of the DSN. The SP coefficients includes a first coefficient (e.g., "a") and a second coefficient (e.g., "b"). For example, the first coefficient is a unique identifier for the corresponding storage pool (e.g., SP #1's ID for SP 1 coefficient "a") and the second coefficient is a weighting factor for the storage pool. The weighting factors are derived to ensure, over time, data is stored in the storage pools in a fair and distributed manner based on the capabilities of the storage units within the storage pools.

For example, the weighting factor includes an arbitrary bias which adjusts a proportion of selections to an associated location such that a probability that a source name will be mapped to that location is equal to the location weight divided by a sum of all location weights for all locations of comparison (e.g., locations correspond to storage units). As a specific example, each storage pool is associated with a location weight factor based on storage capacity such that, storage pools with more storage capacity have a higher location weighting factor than storage pools with less storage capacity.

The deterministic function 83, which may be a hashing function, a hash-based message authentication code function, a mask generating function, a cyclic redundancy code function, hashing module of a number of locations, consistent hashing, rendezvous hashing, and/or a sponge function, performs a deterministic function on a combination and/or concatenation (e.g., add, append, interleave) of the slice identifier 82 and the first SP coefficient (e.g., SU 1 coefficient "a") to produce an interim result 89.

The normalizing function 85 normalizes the interim result 89 to produce a normalized interim result 91. For instance, the normalizing function 85 divides the interim result 89 by a number of possible output permutations of the deterministic function 83 to produce the normalized interim result. For example, if the interim result is 4,325 (decimal) and the number of possible output permutations is 10,000, then the normalized result is 0.4325.

The scoring function 87 performs a mathematical function on the normalized result 91 to produce the score 93. The mathematical function may be division, multiplication, addition, subtraction, a combination thereof, and/or any mathematical operation. For example, the scoring function divides the second SP coefficient (e.g., SP 1 coefficient "b") by the negative log of the normalized result (e.g., $e^y=x$ and/or $\ln(x)=y$). For example, if the second SP coefficient is 17.5 and the negative log of the normalized result is 1.5411 (e.g., $e(0.4235)$), the score is 11.3555.

The ranking function 84 receives the scores 93 from each of the function rating modules 81 and orders them to produce a ranking of the storage pools. For example, if the ordering is highest to lowest and there are five storage pools in the DSN, the ranking function evaluates the scores for five storage pools to place them in a ranked order. From the ranking, the ranking module 84 selects one the storage pools 86, which is the target for a set of encoded data slices.

The DAP 80 may further be used to identify a set of storage units, an individual storage unit, and/or a memory device within the storage unit. To achieve different output results, the coefficients are changed according to the desired location information. The DAP 80 may also output the ranked ordering of the scores.

Figure 10A:
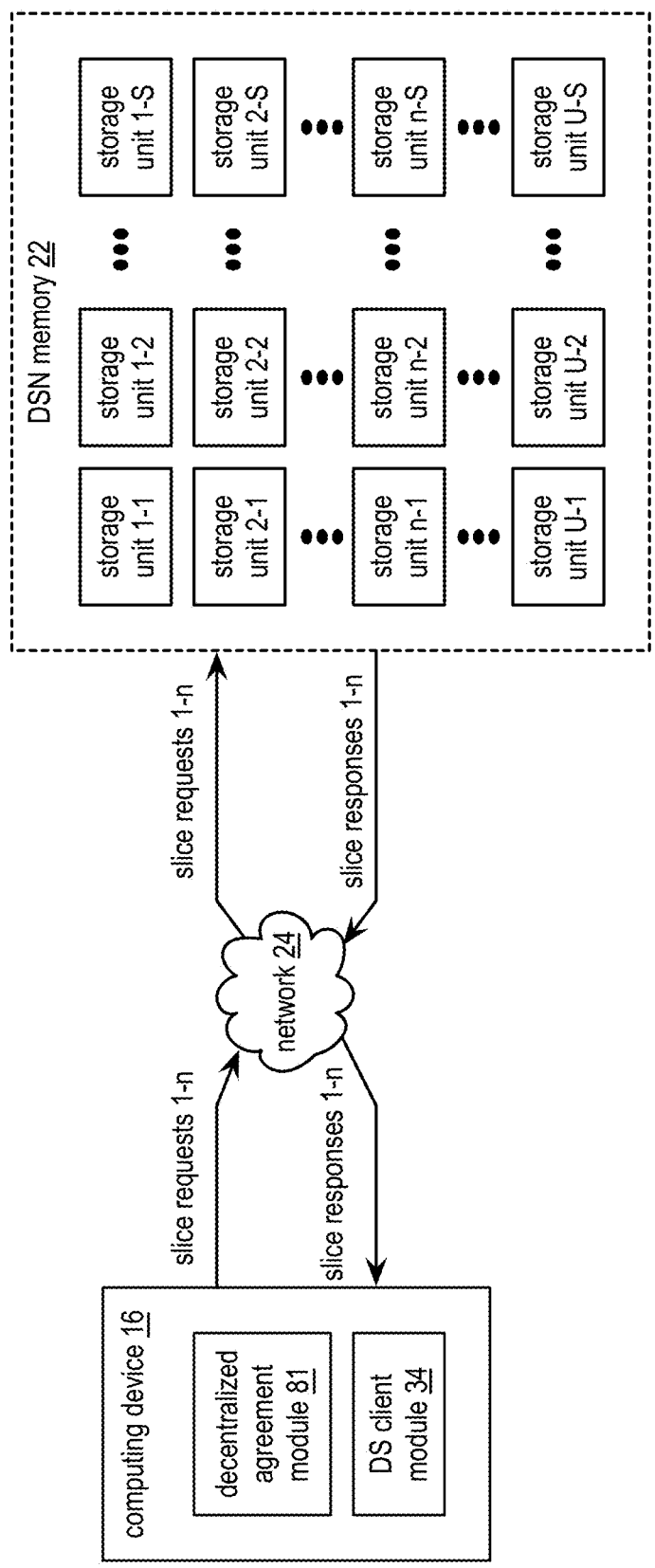
FIG. 10A is a schematic block diagram of another embodiment of a dispersed storage network in accordance with the present invention.

FIG. 10A is a schematic block diagram of another embodiment of a dispersed storage network that includes the computing device 16 of FIG. 1, the network 24 of FIG. 1, and the distributed storage network (DSN) memory 22 of FIG. 1. The DST processing unit 16 includes a decentralized agreement module 81 and the DST client module 34 of FIG. 1. The decentralized agreement module may be implemented utilizing the decentralized agreement protocol 80 of FIG. 9. The DSN memory 22 includes S sets of U storage units (e.g., storage sets 1-S, where each storage set includes storage units 1-U). Each storage unit may be implemented utilizing the storage unit 36 of FIG. 1. The DSN functions to select a storage resource within the DSN memory 22.

In an example of operation of the selecting of the storage resource, the computing device 16 identifies one or more levels of storage resources. The levels of storage resources include one or more of a set of U storage units of the plurality of S sets of storage units, a width n number of storage units of a given set of storage units, and a memory device of a plurality of memory devices of a particular storage unit. The identifying includes one or more of interpreting system registry information, interpreting a query response, performing a test, and interpreting storage unit availability information.

Having identified the one or more levels of storage resources, the computing device 16, for each level of storage resources, obtains resource mapping information. The resource mapping information includes one or more of an identifier of the storage resource, and a weight (e.g., associated with a distributed agreement protocol function) of the storage resource associated with a plurality weights of the plurality of storage resources of the level of storage resources. The obtaining includes one or more of interpreting system registry information, interpreting a query response, and receiving the resource mapping information.

For each level of storage resources, the computing device 16 selects a deterministic function type of a plurality of available deterministic functions. The available deterministic functions include a low computational time intensive type (e.g., consistent hashing) and a linear computational time intensive type (e.g., rendezvous hashing). The selecting includes one or more of identifying a type of the level of storage resources, determining the transit function based on the type of the level of storage resources, interpreting system registry information, and receiving a request. For example, the computing device 16 selects rendezvous hashing when selection of a particular set of storage units of the plurality of sets of storage units includes a frequency of change that is greater than a storage set change frequency threshold level (e.g., storage sets are added and retired often). As another example, the computing device 16 selects the consistent hashing for subsequent selection of a width number of storage units within a particular selected set of storage units when a frequency of change associated with a particular set of storage units is less than a change frequency threshold level for individual storage units (e.g., selecting a storage unit from a large number of logical locations with infrequent changes).

Having selected the deterministic function type, for each level of storage resources, the computing device 16 selects storage resources associated with the level of storage resources in accordance with the selected traffic function type. The selecting includes utilizing the selected terms of function when performing the distributed agreement article function to create a ranked ordered list of resources for the level of storage resources and selects a highest ranked resource as the selected resource. For example, the DS client module 34 determines to utilize the rendezvous hashing approach within the decentralized agreement module to select a storage set of the S storage sets, and within the selected storage set determines to utilize the consistent hashing approach within the decentralized agreement module to select a width number n of storage units of the U storage units of the particular selected storage set. Having selected the storage units, the DS client module 34 issues, via the network 24, slice requests 1-$n$ to the selected storage units and receives, via the network 24, as many as slice responses 1-$n$ from the selected storage units in response.

Figure 10B:
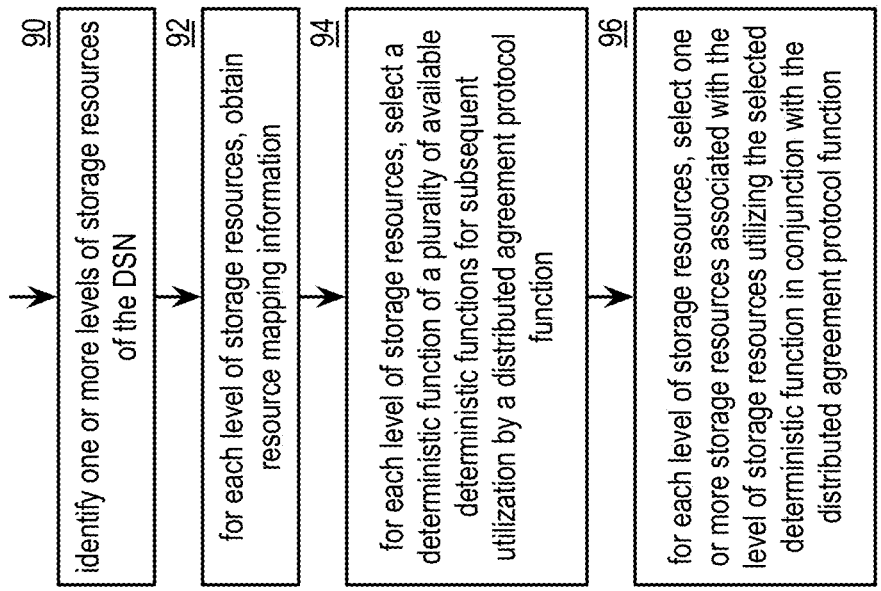
FIG. 10B is a flowchart illustrating an example of selecting a storage resource within a dispersed storage network in accordance with the present invention.

FIG. 10B is a flowchart illustrating an example of selecting a storage resource within a dispersed storage network (DSN). The method begins with step 90, where a processing module (e.g., of a distributed storage (DS) processing unit) identifies one or more levels of storage resources of the DSN. The identifying includes one or more of interpreting system registry information, interpreting a query response, performing a test, and interpreting storage unit availability information.

For each level of storage resources, the method continues at step 92, where the processing module obtains resource mapping information. The obtaining includes at least one of interpreting system registry information, interpreting a query response, and receiving the resource mapping information.

For each level of storage resources, the method continues at step 94, where the processing module selects a deterministic function of a plurality of available deterministic functions for subsequent utilization by a distributed agreement protocol function. The selecting includes one or more of identifying a type of the level of storage resources, determining the deterministic function type based on the type of the level of storage resources, interpreting system registry information, and receiving a request. For example, the processing module selects rendezvous hashing to select a particular set of storage units of the plurality of sets of storage units when a frequency of change associated with the plurality of sets of storage units is greater than a storage set change frequency threshold level. As another example, the processing module selects consistent hashing for subsequent selection of a width number of storage units within a particular set of storage units when a frequency of change associated with a particular set of storage units is less than a change frequency threshold level for storage units.

For each level storage resources, the method continues at step 96, where the processing module selects one or more storage resources associated with the level of storage resources utilizing the selected deterministic function in conjunction with the distributed agreement protocol function the selecting includes utilizing the selected deterministic function when performing the distributed agreement protocol function to create a ranked ordered list of resources for the level of storage resources, and selecting a highest ranked resource as the selected resource (e.g., for each resource of the plurality of resources associated with the resource level), where the selecting further includes performing the distributed agreement protocol function utilizing the selected intrinsic function on a slice name associated with an encoded data slice for accessing utilizing location weights and identifiers associated with the plurality of storage resources to produce the ranked ordered list.

Figure 11:
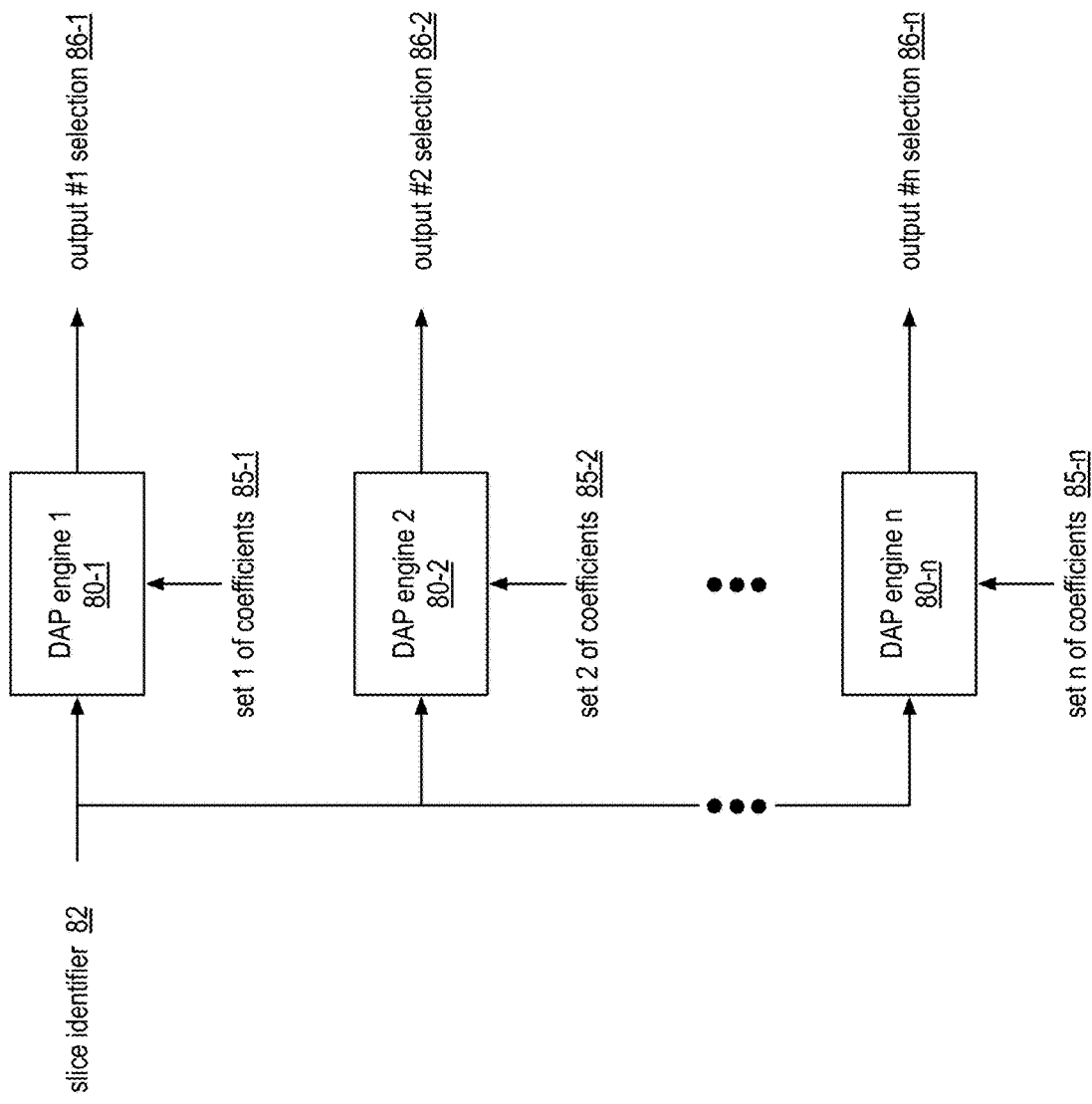
FIG. 11 is a schematic block diagram of an embodiment of a decentralized agreement protocol parallel operation in accordance with the present invention.

FIG. 11 is a schematic block diagram of an embodiment of a decentralized agreement protocol (DAP) system that includes a plurality of DAP engines 80-1 through 80-$n$. A DAP engine is a processing module or module that executes the DAP functionality as shown in FIG. 9. In this example, each DAP engine receives a slice identifier 82 (as described with reference to FIG. 9) and a corresponding set of coefficients 85-1 through 85-$n$. Note that each corresponding set of coefficients includes different values for coefficients a_1 through a_n and coefficients b_1 through b_n of FIG. 9. Based on the slice identifier 82 and the coefficients, each DAP engine produces a unique output selection 86 (e.g., output #1 section 86-1, output #2 selection 86-2, and output # n 86-$n$).

In this embodiment, the DAP system allows for parallel and/or serial-parallel operation generating DSN addresses for the data segment(s) of a data object, or objects, associated with the slice identifier. In general, the DSN 10 uses a logical address namespace that is mapped to the DSN memory 22, which includes storage units that are arranged into a plurality of storage pools. Each storage pool includes a plurality of storage units that is logically organized into one or more sets of storage units and/or as one or more groups of storage units. Further, each storage unit includes a plurality of memory devices. Accordingly, each storage pool of the DSN memory is allocated a portion of the logical address namespace; each storage unit within a storage pool is allocated a sub-portion of the storage pool's namespace portion; and memory device of a storage unit is allocated a micro-portion of the storage unit's sub-portion of the storage pool's namespace portion.

As an example, if the DSN namespace ranges from 0 to 999,999 (decimal) and includes four storage pools, storage pool #1 is allocated DSN addresses 0 to 249,999; storage pool #2 is allocated DSN addresses 250,000 to 499,999; storage pool #3 is allocated DSN addresses 500,000 to 749,999; and storage pool #4 is allocated DSN addresses 750,000 to 999,999. If each storage pool includes five storage units, then each storage unit is allocated 1/5th of the storage pool's allocated DSN addresses. For example, storage unit #1 of storage pool #1 is allocated DSN addresses 0 to 49,999; storage unit #2 is allocated DSN addresses 50,000 to 99,999; and so on. If each storage units includes five memory devices, then each memory device is allocated 1/5th of the storage units DSN addresses. For example, memory device #1 of storage unit #1 of storage pool #1 is allocated DSN addresses 0-9,999; memory device #2 is allocated DSN addresses 10,000 to 19,999; and so on. Note that storage pools do not need to include the same number of storage units and the storage units do not need to include the same number of memory devices.

Via the parallel and/or serial-parallel operation of the DAP system, the system allows for selection of storage pools, storage units, storage unit pillar number assignments, and/or memory devices within a selected storage unit for storing encoded data slices. For example, the first DAP engine is used to select one of storage pools, the second DAP engine is for selection storage units of the storage pool, the third DAP engine is used for selecting pillar numbers for the selected storage units, and a fourth DAP engine is used for selecting a memory device within the storage units.

Figure 12:
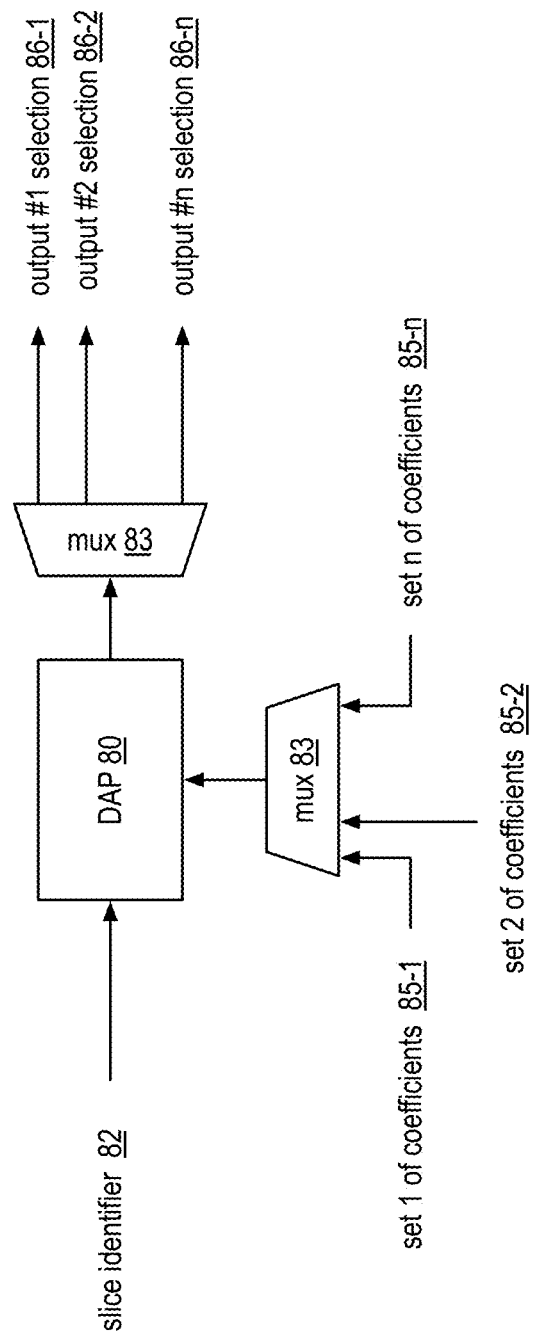
FIG. 12 is a schematic block diagram of an embodiment of a decentralized agreement protocol serial operation in accordance with the present invention.

FIG. 12 is a schematic block diagram of another embodiment of a decentralized agreement protocol (DAP) system that includes a DAP engine 80 and multiplexers 81 and 83. The DAP engine 80 receives the slice identifier 82 and one set of coefficients 85-1 through 85-$n$ through multiplexer 81. Based on the selected set of coefficients and the slice identifier, the DAP engine generates an output selection that is provided to multiplexer 83. Note that multiplexer 83 may be omitted.

For example, the DAP engine 80 performs the DAP function (as described with reference to FIG. 9) on the slice identifier 82 using set 1 of the coefficients 85-1 to produce a first output selection 86-1. When the second set of coefficients 85-2 are selected, the DAP engine performs the DAP function on the slice identifier to produce a second output selection 86-2. Note the set 2 of coefficients 85-2 may be at least determined based on the output #1 selection 86-1. This continues until the DAP engine performs the DAP function on an $n^{th}$ set of coefficients 85-$n$ and the slice identifier 82 to produce an $n^{th}$ output selection 86-$n$.

As a more specific example, the first set of coefficients are storage pool coefficients such that the first output selection is regarding selection of a storage pool. The second set of coefficients are storage unit coefficients for selecting storage units within the selected storage pool such that the second output selection is regarding selection of storage units. The third set of coefficients are pillar number coefficients for selecting storage unit pillar numbers within the selected storage units such that the third output selection is regarding selection of a pillar numbering order. The fourth set of coefficients are memory device coefficients for selecting memory devices within the selected storage units such that the fourth output selection is regarding selection of memory devices.

Figure 13:
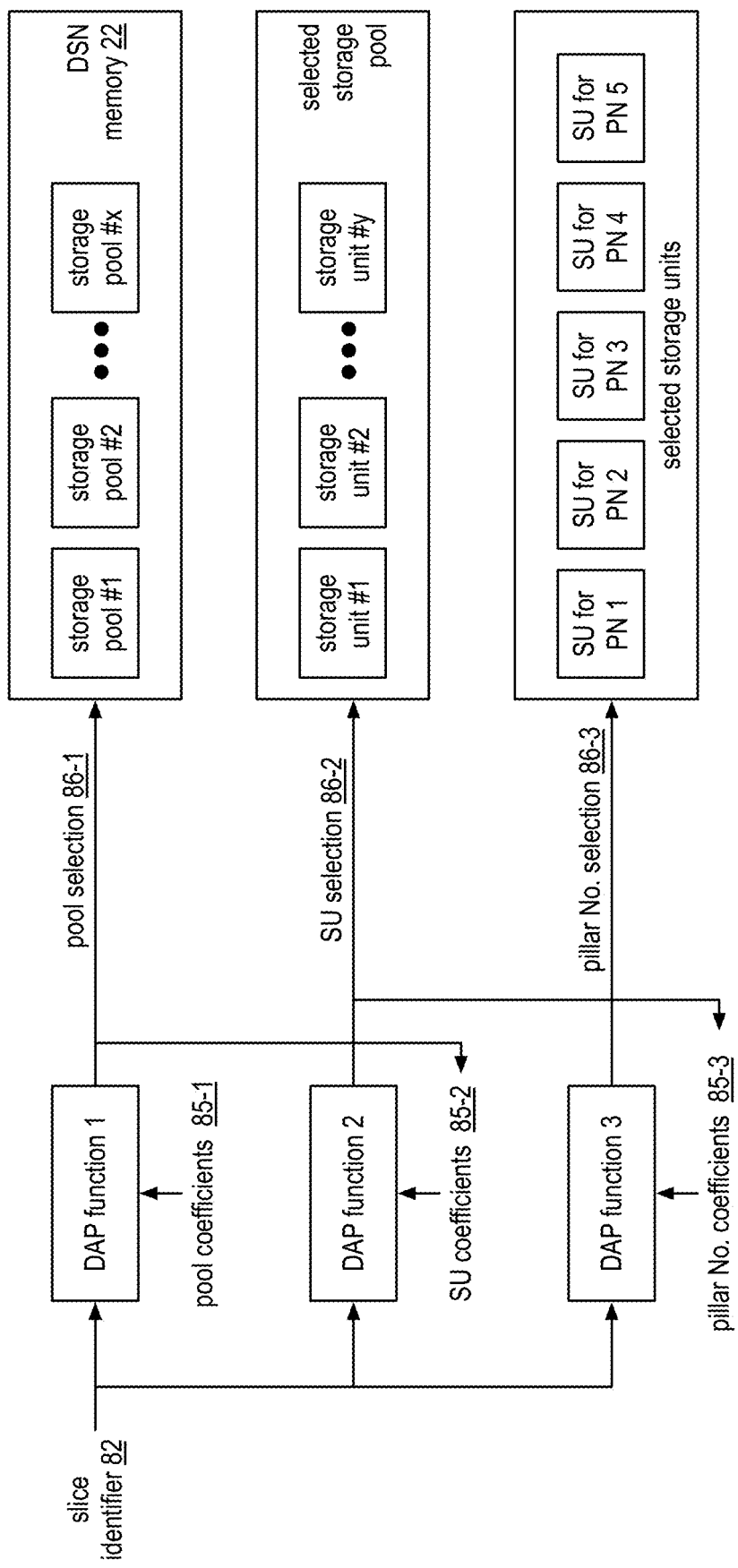
FIG. 13 is a schematic block diagram of another embodiment of a decentralized agreement protocol in accordance with the present invention.

FIG. 13 is a schematic block diagram of another embodiment of a decentralized agreement protocol (DAP) system. As illustrated, a slice identifier 82 is provided to DAP function 1, DAP function 2 and DAP function 3. Each DAP function is also provided a corresponding coefficient 85-1 through 85-3. The DAP function then outputs a selection (e.g., selection 86-1-86-3).

As a specific example, DAP function 1 receives slice identifier 82 and pool coefficients 85-1, performs the DAP function 1 on the slice identifier 82 and pool coefficients 85-1 to produce pool selection 86-1. The pool selection 86-1 indicates storage pool 2 of DSN memory 22. A DAP function 2 receives slice identifier 82 and storage unit (SU) coefficients 85-2 (which include pool selection 86-1), performs the DAP function 2 on the slice identifier 82 and pool coefficients 85-2 to produce SU selection 86-2. For example, SU selection 86-2 indicates storage unit 1 of the selected storage pool (e.g., storage pool 2). A DAP function 3 receives slice identifier 82 and storage unit (SU) coefficients 85-3 (which includes pool selection 86-2), performs the DAP function 3 on the slice identifier 82 and pool coefficients 85-3 to produce a pillar number selection 86-3. In this example, the pillar number selection indicates storage unit 1 for pillar number 4.

Figure 14A:
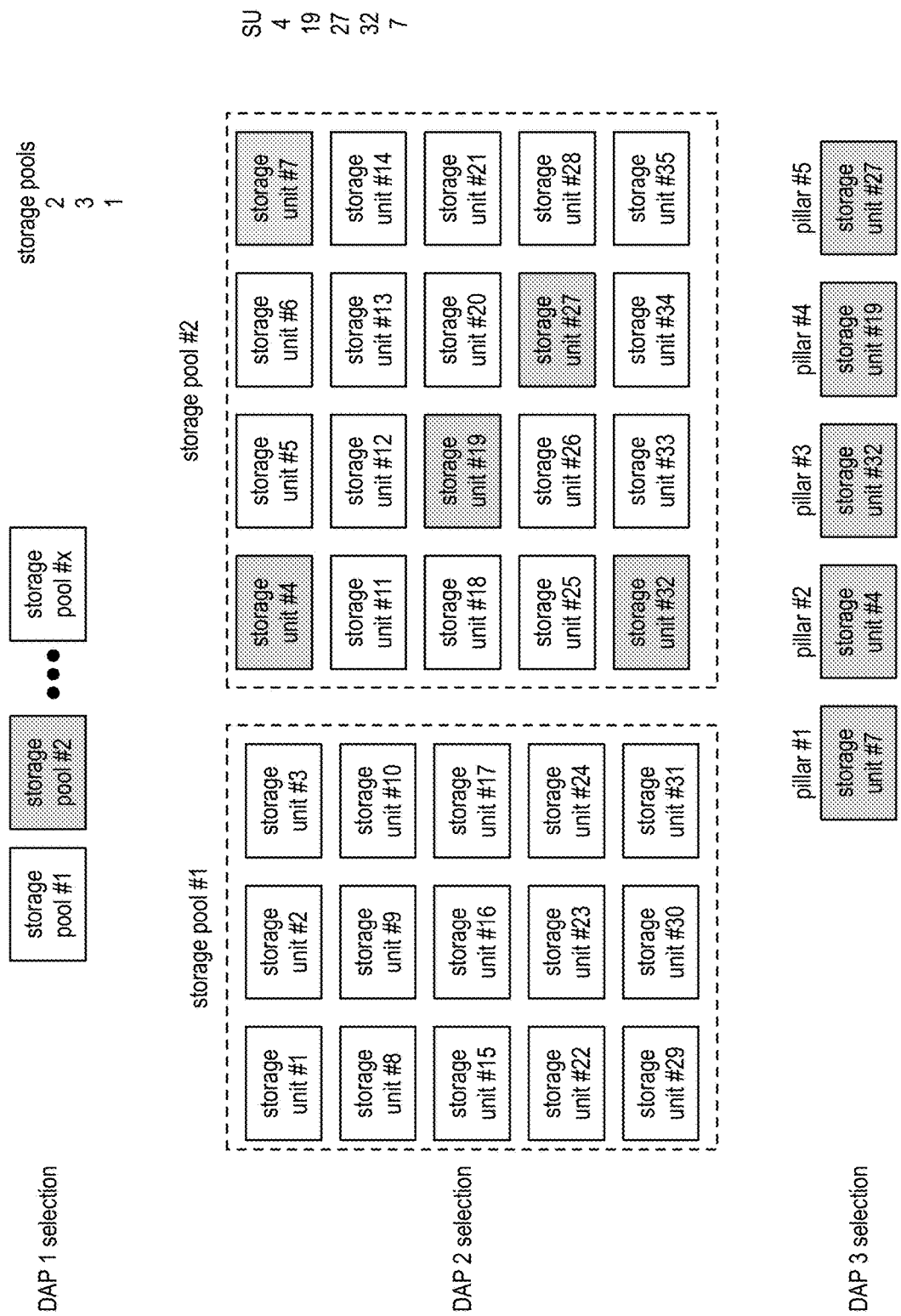
FIG. 14A is a schematic block diagram of an embodiment of a dynamic decentralized agreement protocol in accordance with the present invention.

FIG. 14A is a schematic block diagram of an embodiment of a dynamic decentralized agreement protocol system which includes three DAP functions. As illustrated, the first DAP function selects a storage pool from a plurality of storage pools. As a specific example, DAP 1 selects storage pool 2 from the plurality of storage pools 1-$x$. The DAP 2 selects a number of storage units of the selected storage pool according to the dispersed storage error encoding parameters. For example, the second DAP function selects the top five (e.g., pillar width number) ranked storage units (e.g., storage units 7, 4, 32, 19 and 27) from storage pool 2. The third DAP function selects storage units for each pillar number. For example, DAP 3 selects storage unit 7 for pillar 1, storage unit 4 for pillar 2, storage unit 32 for pillar 3, storage unit 19 for pillar 4, and storage unit 27 for pillar 5.

Figure 14B:
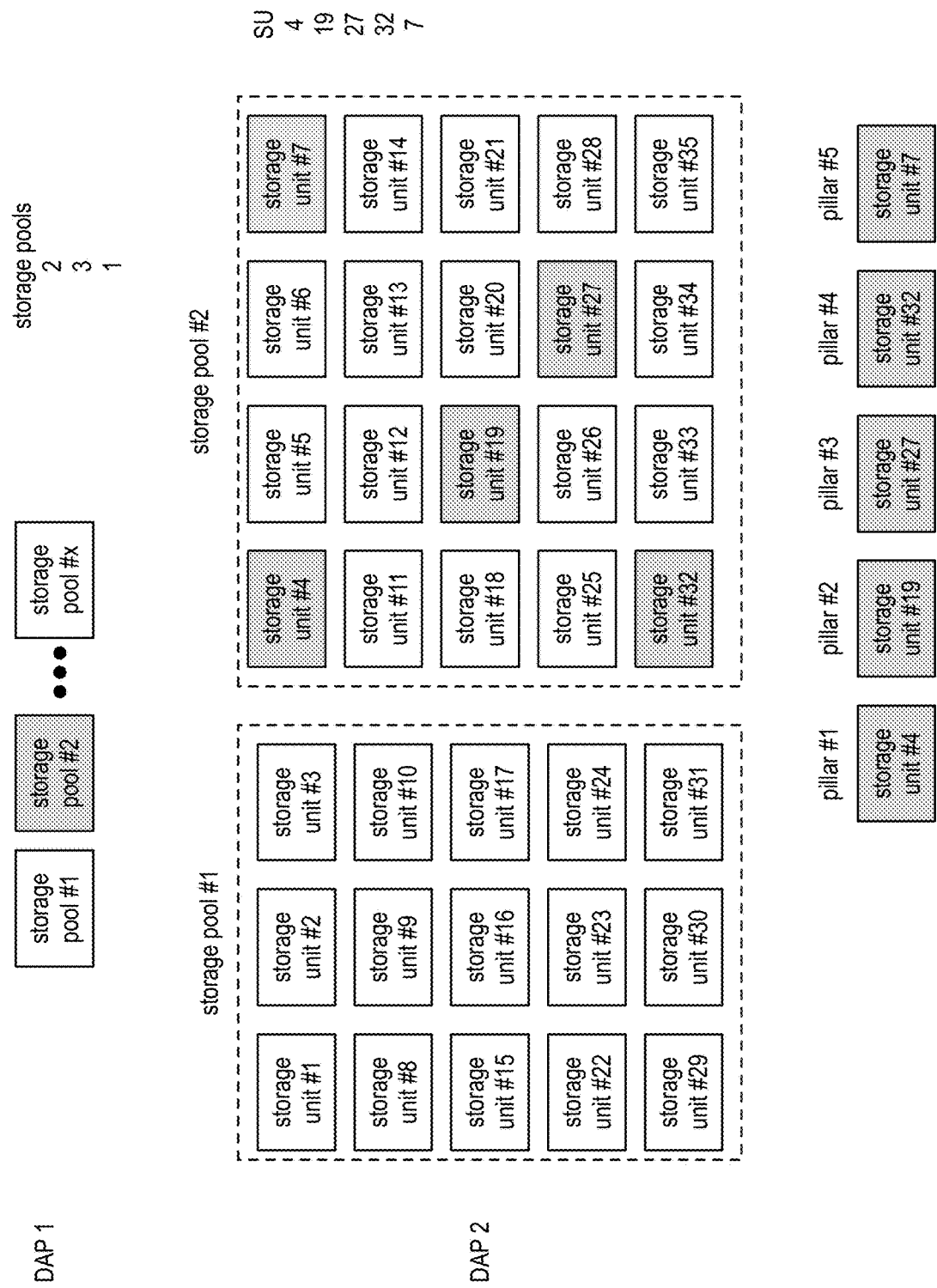
FIG. 14B is a schematic block diagram of an embodiment of a dynamic decentralized agreement protocol in accordance with the present invention.

FIG. 14B is a schematic block diagram of another embodiment of a dynamic decentralized agreement protocol. In this example, the DAP 1 function selects storage pool 2 and the DAP 2 function selects storage units 4, 19, 27, 32, and 7. According to the rankings, the second DAP function ranked in sequential order from highest to fifth highest, storage units 4, 19, 27, 32 and 7 of storage pool 2. In this embodiment, the rank order is used to determine the pillar number. For example, pillar 1 is assigned to storage unit 4, pillar 2 is assigned to storage unit 19, pillar 3 is assigned to storage unit 27, pillar 4 is assigned to storage unit 32 and pillar 5 is assigned to storage unit 7.

Figure 14C:
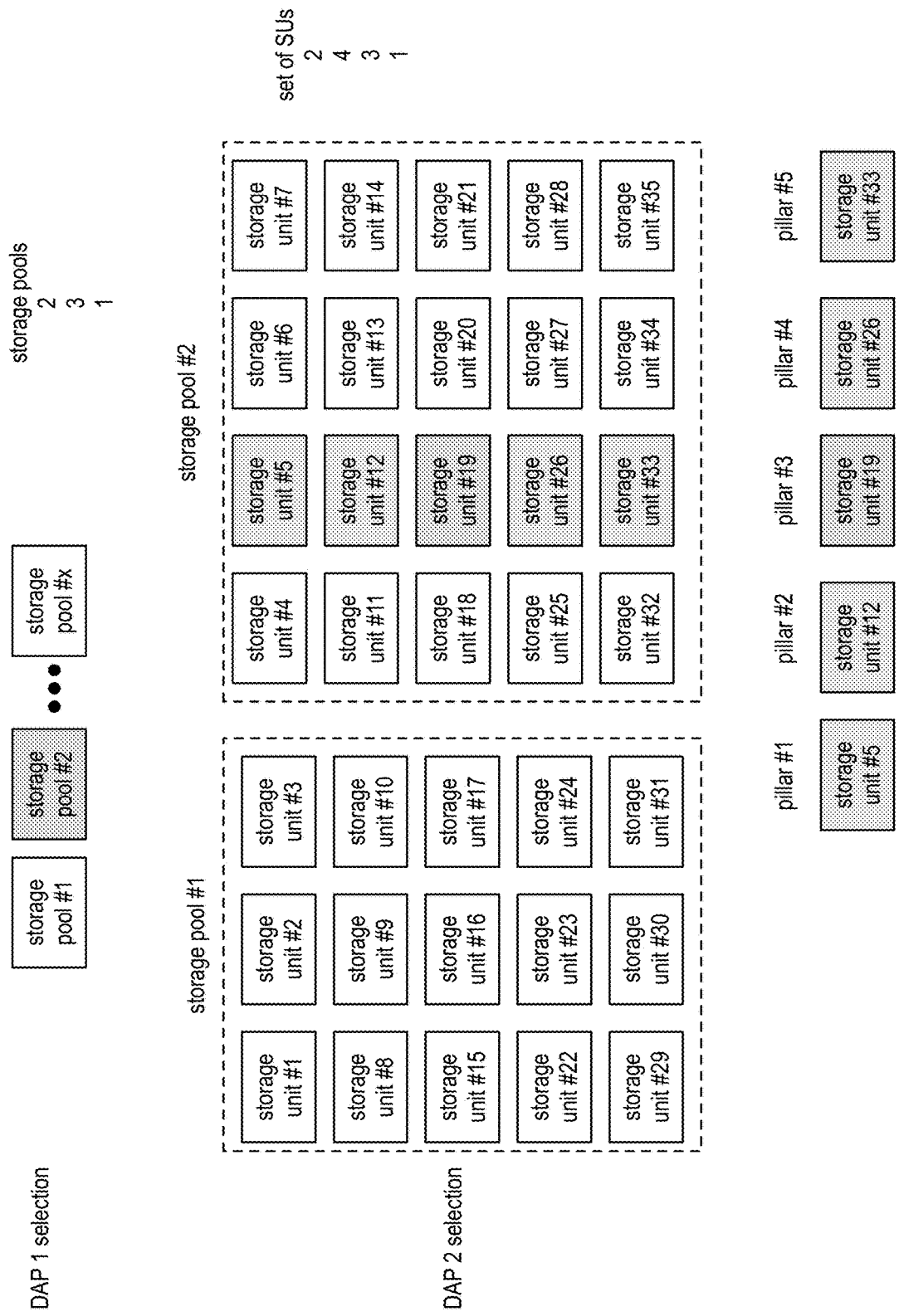
FIG. 14C is a schematic block diagram of an embodiment of a dynamic decentralized agreement protocol in accordance with the present invention.

FIG. 14C is a schematic block diagram of another embodiment of a dynamic decentralized agreement protocol. In this example, the DAP 1 function selects storage pool 2. The second DAP function ranks sets of storage units (e.g., a column of storage units) and selects the highest ranked set. For example, the DAP 2 function selects the second column of storage units (e.g., storage units 5, 12, 19, 26 and 33). The second DAP function is also used to select storage units for each pillar number. For example, the order of the storage units of the set of storage units is used to assign storage units for each pillar number. As illustrated, storage unit 5 is selected for pillar 1, storage unit 12 is selected for pillar 2, storage unit 19 is selected for pillar 3, storage unit 26 is selected for pillar 4, storage unit 33 is selected for pillar 5.

Figure 14D:
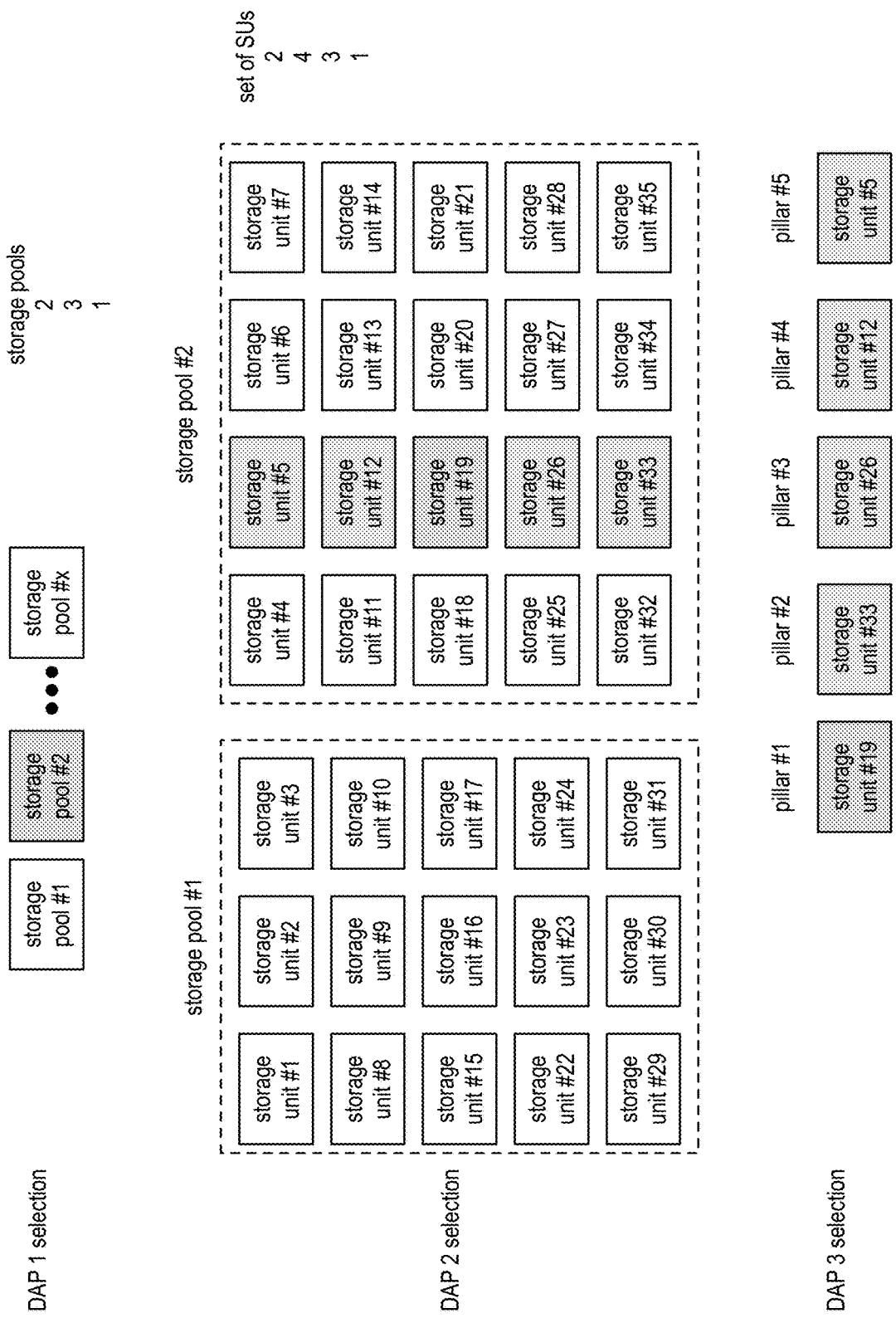
FIG. 14D is a schematic block diagram of an embodiment of a dynamic decentralized agreement protocol in accordance with the present invention.

FIG. 14D is a schematic block diagram of another embodiment of a dynamic decentralized agreement protocol. This example is similar to FIG. 13C, as the DAP 1 function selects storage pool 2 and the second DAP function ranks sets of storage units (e.g., a column of storage units) and selects the highest ranked set. For example, the DAP 2 function selects the second column of storage units (e.g., storage units 5, 12, 19, 26 and 33). In the present example, the third DAP function randomly distributes storage units across a set of pillar numbers. For example, storage unit 19 is assigned to pillar 1 for a first write request and storage unit 33 is assigned to pillar 1 for a next write request.

Figure 15:
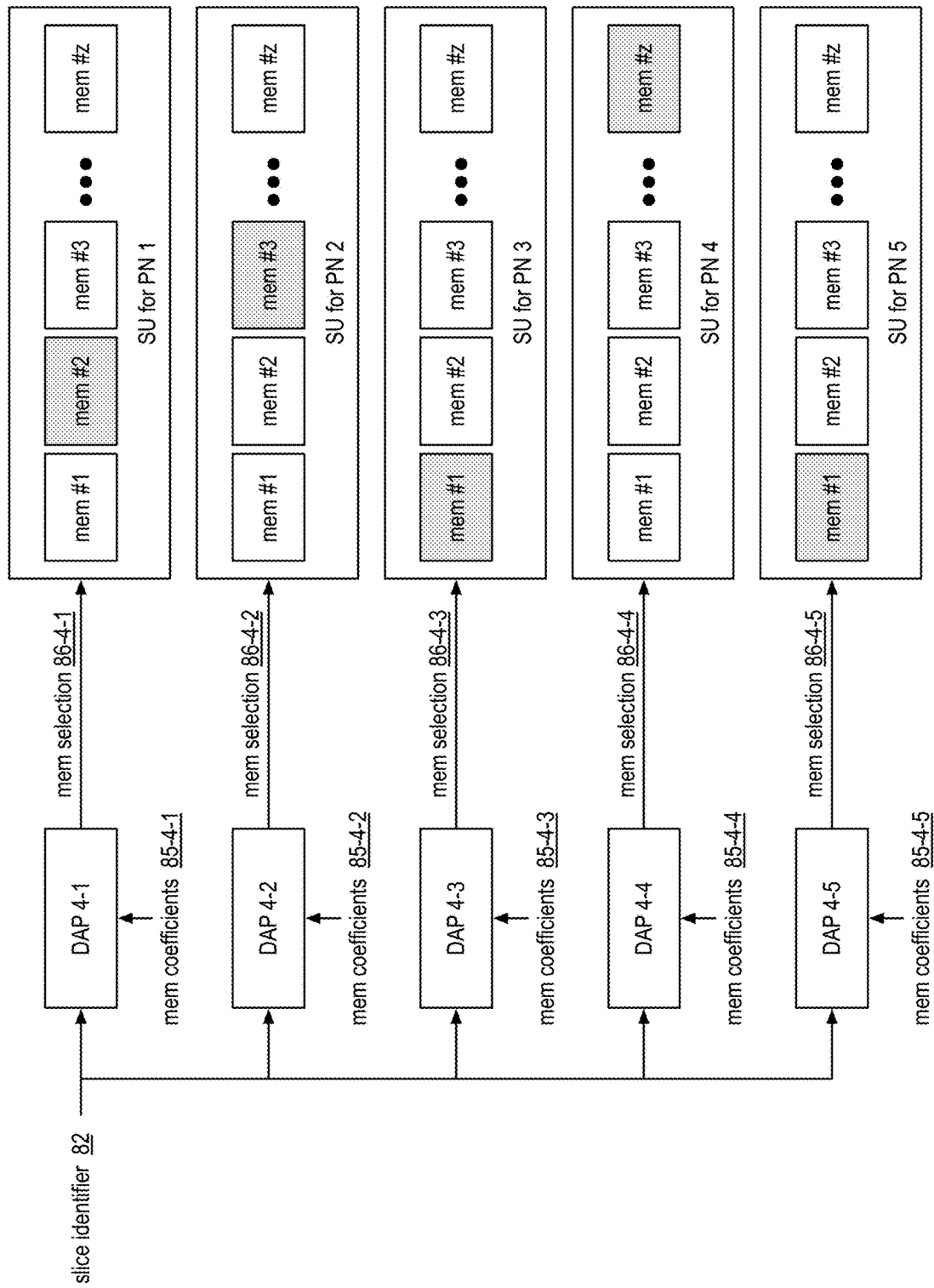
FIG. 15 is a schematic block diagram of another embodiment of a dynamic decentralized agreement protocol in accordance with the present invention.

FIG. 15 is a schematic block diagram of another embodiment of a dynamic decentralized agreement protocol (DAP). As illustrated, a slice identifier 82 is input to a set of DAP 4 engines (e.g., DAP 4-1, 4-2, 4-3, 4-4, and 4-5). Each DAP 4 engine performs a fourth distributed agreement protocol (DAP) function using the slice identifier 82 and a corresponding set of memory coefficients (e.g., mem coefficients 85-4-1 through mem coefficients 85-4-5) to identify memory devices of the storage units. As a specific example, the DAP 4-1 receives a slice identifier 82 and mem coefficients 85-4-1 and performs a fourth DAP function on the slice identifier and memory coefficients 85-4-1 to produce memory selection 86-4-1. In this example, the memory selection 86-4-1 identifies memory device 2 of the storage unit for pillar number 1. Note each DAP function (DAP 4-1 through DAP 4-5) may be run independently (e.g., in a parallel operation).

Figure 16:
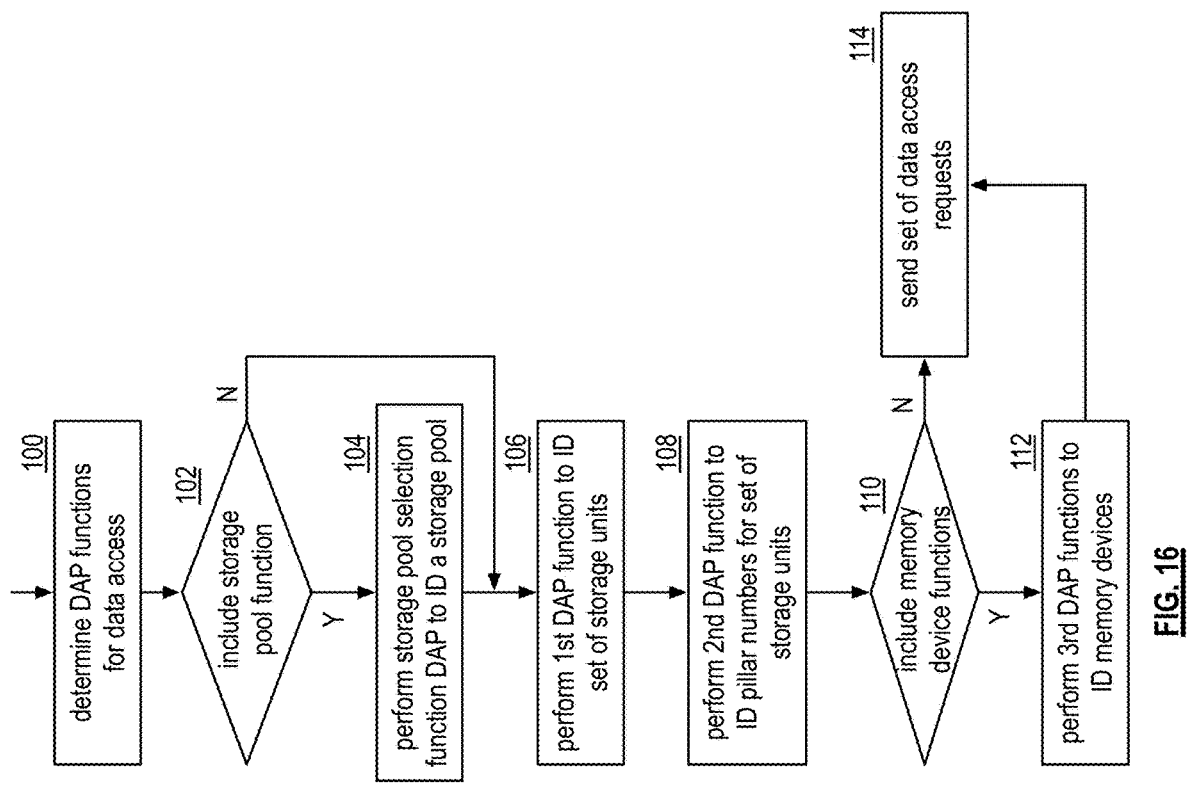
FIG. 16 is a logic flow diagram of an embodiment of a dynamic decentralized agreement protocol in accordance with the present invention.

FIG. 16 is a logic flow diagram of a method of accessing a set of encoded data slices in a dispersed storage network (DSN) in accordance with the present invention. The method begins at step 100, where the device determines distributed agreement protocol (DAP) functions for data access. The method continues at step 102, where the device determines whether to include a storage pool DAP function. When the device determines to include the storage pool DAP function, the method continues to step 104, where the device performs a storage pool selection distributed agreement protocol (DAP) function using a slice identifier and a storage pool set of coefficients to identify a storage pool of a plurality of storage pools of the DSN. Note the storage pool includes a plurality of storage units. Further note the slice identifier may include one or more of pillar number information, data segment number information, a vault identifier, a data object identifier and revision information.

When the device does not include the storage pool DAP function, the method continues to step 106, where the device performs a first DAP function using a slice identifier and a first set of coefficients to identify a set of storage units of a plurality of storage units. As an example, a device performs the first DAP function by performing a plurality of rating functions based on the slice identifier and the first set of coefficients to produce a plurality of ratings for the plurality of storage units. For example, for a rating function of the plurality of rating functions, the device performs a deterministic function on the slice identifier and a first coefficient of the first set of coefficients to produce an interim result, performs a normalizing function on the interim result to produce a normalized result, and performs a scoring function on the normalized result based on a second coefficient of the first set of coefficients to produce a rating of the plurality of ratings. The device then selects, in accordance with a ranking function, the set of storage units from the plurality of storage units based on the plurality of ratings The method continues to step 108, where the device performs a second DAP function using the slice identifier and a second set of coefficients to identify pillar numbers for the set of storage units. Note a first encoded data slice of a set of encoded data slices has a first pillar number as is to be accessed via a storage unit of the set of storage units being assigned the first pillar number of the pillar numbers.

The method continues at step 110, where the device determines whether to include memory device DAP functions. When the device determines not to perform the third DAP functions, the method continues to step 114. When the device determines to perform the third DAP functions, the method continues to step 112, where the device performs third DAP functions to identify memory devices of a storage unit. For example, the device performs a first third DAP function using the slice identifier and a first third set of coefficients to identify a memory device of a plurality of memory devices of a first pillar number storage unit of the set of storage units. As another example, the device performs a second third DAP function using the slice identifier and a second third set of coefficients to identify a memory device of a plurality of memory devices of a second pillar number storage unit of the set of storage units and performs a third third DAP function using the slice identifier and a third third set of coefficients to identify a memory device of a plurality of memory devices of a third pillar number storage unit of the set of storage units.

The method continues to step 114, where the device sends a set of data access requests to the set of storage units in accordance with the pillar numbers. Each data access request of the set of data access requests includes a slice name for a corresponding one of the set of encoded data slices. Note the slice name includes one of the pillar numbers. Further note that each DAP function may be performing by the same DAP engine or by different DAP engines.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

The invention claimed is:

1. A method for execution by a device of a dispersed storage network (DSN) to access a set of encoded data slices, the method comprises:
   identifying a set of storage units of a plurality of sets of storage units of a storage pool by:
      determining a first deterministic function from a plurality of deterministic functions based on a frequency of change of the plurality of sets of storage units; and
      performing a first distributed agreement protocol (DAP) function using a slice identifier and a first set of coefficients to identify the set of storage units, wherein the first DAP function includes the first deterministic function;
   identifying pillar numbers for the set of storage units by:
      determining a second deterministic function from the plurality of deterministic functions based on a frequency of change of the set of storage units; and
      performing a second DAP function using the slice identifier and a second set of coefficients to identify the pillar numbers, wherein the second DAP function includes the second deterministic function; and
   sending a set of data access requests to the set of storage units in accordance with the pillar numbers, wherein a data access request of the set of data access requests includes a slice name for a corresponding one of the set of encoded data slices and wherein the slice name includes one of the pillar numbers.

2. The method of claim 1, wherein the performing the first DAP function further comprises identifying the storage pool of a plurality of storage pools by:
   performing a storage pool selection DAP function using the slice identifier and a storage pool set of coefficients to identify the storage pool, wherein the storage pool includes the plurality of sets of storage units.

3. The method of claim 1, wherein the slice identifier comprises one or more of:
   pillar number information;
   data segment number information;
   a vault identifier;
   a data object identifier; and
   revision information.

4. The method of claim 1 further comprises:
   performing the first DAP function using a first DAP engine; and
   performing the second DAP function using a second DAP engine.

5. The method of claim 1 further comprises:
   performing the first DAP function using a DAP engine by providing the DAP engine with the slice identifier and the first set of coefficients; and
   performing the second DAP function using the DAP engine by providing the DAP engine with the slice identifier and the second set of coefficients.

6. The method of claim 1 further comprises:
   performing a first third DAP function using the slice identifier and a first third set of coefficients to identify a memory device of a plurality of memory devices of a first pillar number storage unit of the set of storage units;
   performing a second third DAP function using the slice identifier and a second third set of coefficients to identify a memory device of a plurality of memory devices of a second pillar number storage unit of the set of storage units; and
   performing a third third DAP function using the slice identifier and a third third set of coefficients to identify a memory device of a plurality of memory devices of a third pillar number storage unit of the set of storage units.

7. The method of claim 1, wherein performing the first DAP function comprises:
   performing a plurality of rating functions based on the slice identifier and the first set of coefficients to produce a plurality of ratings for the plurality of sets of storage units; and
   selecting, in accordance with a ranking function, the set of storage units from the plurality of sets of storage units based on the plurality of ratings.

8. The method of claim 7 further comprises:
   for a rating function of the plurality of rating functions:
      performing the first deterministic function of the plurality of deterministic functions on the slice identifier and a first coefficient of the first set of coefficients to produce an interim result;
      performing a normalizing function on the interim result to produce a normalized result; and
      performing a scoring function on the normalized result based on a second coefficient of the first set of coefficients to produce a rating of the plurality of ratings.

9. A computing device of a dispersed storage network (DSN), the computing device comprises:
   an interface;
   memory;
   a processing module operably coupled to the memory and the interface, wherein the processing module is operable to access a set of encoded data slices by:
   identifying a set of storage units of a plurality of sets of storage units of a storage pool by:
      determining a first deterministic function from a plurality of deterministic functions based on a frequency of change of the plurality of sets of storage units; and
      performing a first distributed agreement protocol (DAP) function using a slice identifier and a first set of coefficients to identify the set of storage units, wherein the first DAP function includes the first deterministic function;
   identifying pillar numbers for the set of storage units by:
      determining a second deterministic function from the plurality of deterministic functions based on a frequency of change of the set of storage units; and
      performing a second DAP function using the slice identifier and a second set of coefficients to identify the pillar numbers, wherein the second DAP function includes the second deterministic function; and
      sending, via the interface, a set of data access requests to the set of storage units in accordance with the pillar numbers, wherein a data access request of the set of data access requests includes a slice name for a corresponding one of the set of encoded data slices and wherein the slice name includes one of the pillar numbers.

10. The computing device of claim 9, wherein the processing module is operable to perform the first DAP function further to identify the storage pool of a plurality of storage pools by:
   performing a storage pool selection DAP function using the slice identifier and a storage pool set of coefficients to identify the storage pool, wherein the storage pool includes the plurality of sets of storage units.

11. The computing device of claim 9, wherein the slice identifier comprises one or more of:
- pillar number information;
- data segment number information;
- a vault identifier;
- a data object identifier; and
- revision information.

12. The computing device of claim 9, wherein the processing module is further operable to:
- perform the first DAP function using a first DAP engine; and
- perform the second DAP function using a second DAP engine.

13. The computing device of claim 9, wherein the processing module is further operable to:
- perform the first DAP function using a DAP engine by providing the DAP engine with the slice identifier and the first set of coefficients; and
- perform the second DAP function using the DAP engine by providing the DAP engine with the slice identifier and the second set of coefficients.

14. The computing device of claim 9, wherein the processing module is further operable to:
- perform a first third DAP function using the slice identifier and a first third set of coefficients to identify a memory device of a plurality of memory devices of a first pillar number storage unit of the set of storage units;
- perform a second third DAP function using the slice identifier and a second third set of coefficients to identify a memory device of a plurality of memory devices of a second pillar number storage unit of the set of storage units; and
- perform a third third DAP function using the slice identifier and a third third set of coefficients to identify a memory device of a plurality of memory devices of a third pillar number storage unit of the set of storage units.

15. The computing device of claim 9, wherein the processing module is operable to perform the first DAP function by:
- performing a plurality of rating functions based on the slice identifier and the first set of coefficients to produce a plurality of ratings for the plurality of sets of storage units; and
- selecting, in accordance with a ranking function, the set of storage units from the plurality of sets of storage units based on the plurality of ratings.

16. The computing device of claim 15, wherein the processing module is further operable to:
- for a rating function of the plurality of rating functions:
  - perform the first deterministic function of the plurality of deterministic functions on the slice identifier and a first coefficient of the first set of coefficients to produce an interim result;
  - perform a normalizing function on the interim result to produce a normalized result; and
  - perform a scoring function on the normalized result based on a second coefficient of the first set of coefficients to produce a rating of the plurality of ratings.

* * * * *